United States Patent
Willis et al.

(10) Patent No.: US 7,154,333 B2
(45) Date of Patent: Dec. 26, 2006

(54) AMPLIFIER FOR INDUCTIVE LOADS

(75) Inventors: Scott C. Willis, Fairfax Station, VA (US); Richard M. Brosh, Manassas, VA (US)

(73) Assignee: Bae Systems Information and Electronic Systems Integration Inc., Nashua, NH (US)

(*) Notice: Subject to any disclaimer, the term of this patent is extended or adjusted under 35 U.S.C. 154(b) by 87 days.

(21) Appl. No.: 11/014,567

(22) Filed: Dec. 16, 2004

(65) Prior Publication Data

US 2006/0132238 A1   Jun. 22, 2006

(51) Int. Cl.
*H03F 3/45* (2006.01)

(52) U.S. Cl. .................................................... 330/255

(58) Field of Classification Search ................. 330/255
See application file for complete search history.

(56) References Cited

U.S. PATENT DOCUMENTS

| | | | | |
|---|---|---|---|---|
| 3,747,006 A | * | 7/1973 | Freebom | 330/260 |
| 3,872,386 A | * | 3/1975 | Luhowy | 324/98 |
| 4,169,996 A | * | 10/1979 | Cavigelli | 330/99 |
| 4,426,552 A | * | 1/1984 | Cowans et al. | 381/94.9 |
| 6,201,442 B1 | * | 3/2001 | James et al. | 330/107 |
| 6,707,339 B1 | * | 3/2004 | Kase et al. | 330/255 |

* cited by examiner

*Primary Examiner*—Robert Pascal
*Assistant Examiner*—Krista M. Flanagan
(74) *Attorney, Agent, or Firm*—Mark A. Wurm; Daniel J. Long

(57) ABSTRACT

An amplifier circuit controls the output current through an inductive load. A signal is amplified by one or more op amps, and sourced into a back to back coupling of an NPN transistor and a PNP transistor. In a positive circuit segment, current is sourced to an inductive load, and in a negative segment, current is sunk from the inductive load. The current at the output of the inductive load flows through a resistor, and the resultant voltage drop is negatively fed back to the op amp.

20 Claims, 1 Drawing Sheet

AMPLIFIER FOR INDUCTIVE LOADS

FIELD OF INVENTION

The present invention relates to amplifiers, and in particular, amplifiers for inductive loads in which the output current is regulated.

BACKGROUND OF INVENTION

Many electronic systems require power amplifiers to drive inductive loads. For example, power amplifier electronics are commonly required in satellites for various servo-control systems such as voice coil actuators for imaging applications. However, the high inductance associated with voice coil actuators poses a challenge to maintaining stability and accuracy with conventional amplifier topologies. The art is therefore in need of an amplifier circuit whose output current is finely tunable based on an input voltage to the amplifier. Such a high precision amplifier circuit could be used in connection with a voice coil that controls high precision instruments, such as optical instruments, that may require adjustments down to a nanometer scale.

SUMMARY OF EMBODIMENTS

The present invention is an amplifier circuit for an inductive load. The circuit has an inner stage that is a voltage loop, and an overall major loop that controls the current. An input voltage is supplied to the amplifier, and the output current of the inductive load can be precisely controlled by varying the input voltage. The current output of the inductive load is directed through a resistance, and the voltage drop across that resistance is fed back to the input of the circuit. The amplifier is a class B amplifier, having a segment that operates when the input is a positive voltage, and a segment that operates when the input is a negative voltage.

It is therefore an object of an embodiment of the invention to regulate the output current of an amplifier that is connected to an inductive load.

DETAILED DESCRIPTION OF EMBODIMENTS

Figure 1:
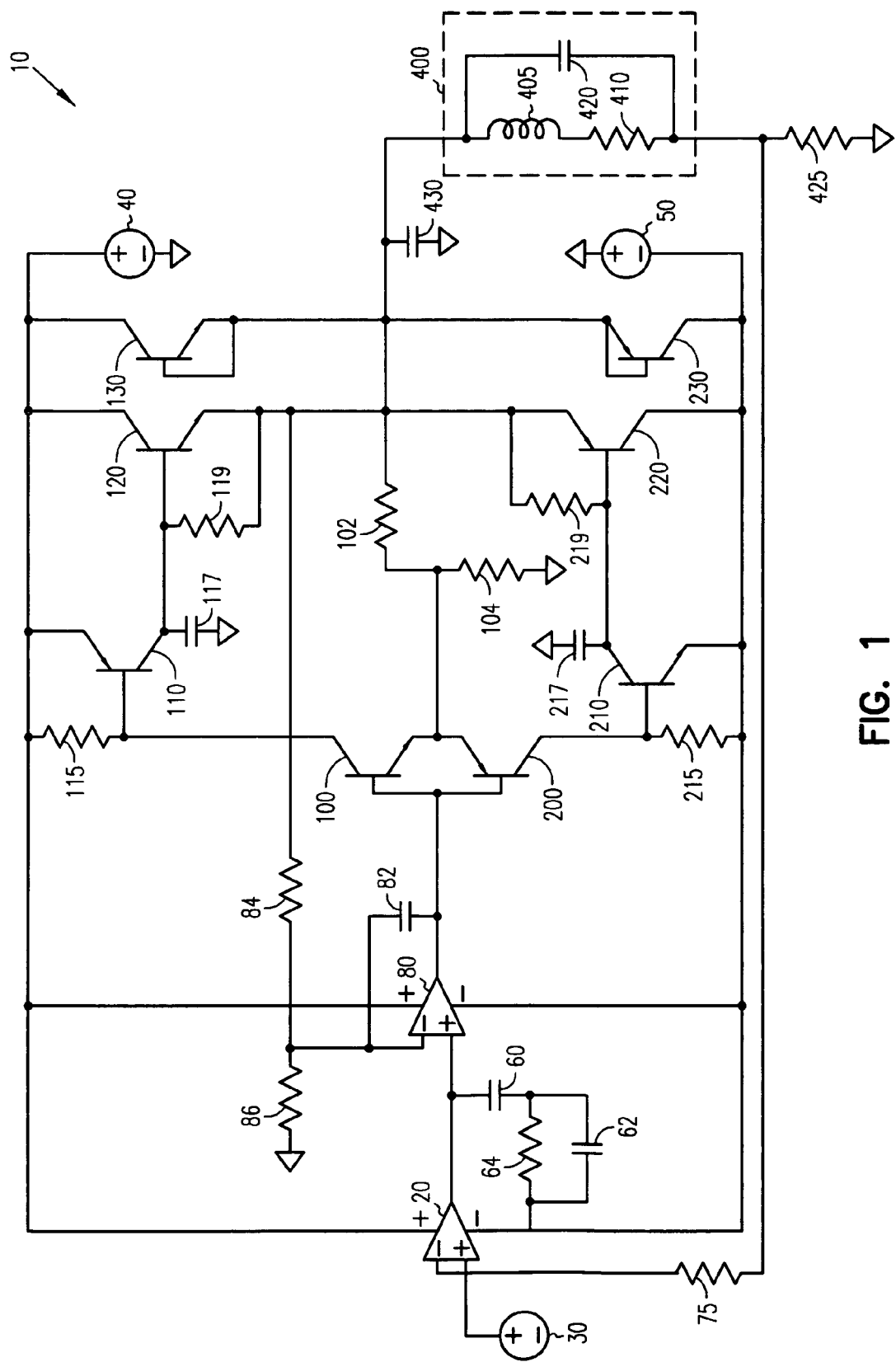
FIG. 1 is a circuit diagram of an embodiment of the amplifier circuit of the invention.

FIG. 1 illustrates an embodiment of an amplifier circuit of the invention. The embodiment of the amplifier circuit of FIG. 1 is shown in connection with an inductive voice coil. However, other inductive loads could be used in connection with the amplifier circuit of the invention.

The amplifier 10 illustrated in FIG. 1 has a general purpose op amp 20. An example of an op amp that could be used for the op amp 20 in the circuit is Model No. AD8610 manufactured by Analog Devices. The op amp 20 receives a signal into its positive input terminal from a signal source 30. The input into the negative terminal of the op amp 20 originates from two feedback sources. The first source is a capacitor 60 that is in series with a parallel combination of resistor 64 and capacitor 62 that are shunted off the output of the op amp 20. The second source into the negative terminal of op amp 20 is feedback voltage from voice coil 400 through resistors 75 and 425. The capacitors 60 and 62, and the resistors 64 and 75 serve a feedback compensation function for the op amp 20. The op amp 20 is powered by supply voltages 40 and 50.

The output of op amp 20 is sourced into the positive terminal of op amp 80. An example of an op amp that could be used for op amp 80 in the circuit is Model No. AD8610 manufactured by Analog Devices. Op amp 80, like op amp 20, is powered by voltage sources 40 and 50. Op amp 80 receives negative feedback through capacitor 82 and from a positive segment of the amplifier circuit through resistors 84 and 86. Capacitor 82 serves a feedback compensation role for op amp 80. Resistors 84 and 86 provide the gain for op amp 80 ($Gain_{80}=1+R84/R86$). The output of op amp 80 is fed into two transistors 100 and 200 that are connected back to back and that serve as the gate into a positive segment of the circuit and a negative segment of the circuit.

In an embodiment, the output of op amp 80 is connected to the bases of NPN transistor 100 and PNP transistor 200. In one embodiment, the transistor 100 may be of type 2N2222A, and the transistor 200 may be of type 2N2907A. The collectors of transistors 100 and 200 are connected to the positive and negative segments of the amplifier circuit respectively. The positive segment of the amplifier circuit encompasses transistors 110, 120, and 130, and voltage source 40. In an embodiment, transistor 110 is a PNP small signal complimentary transistor (e.g. type 2N2907A), transistor 120 is an NPN complimentary power transistor (e.g. type SFT504), and transistor 130 is a diode connected transistor (e.g. type 2N2222A). The negative segment of the circuit encompasses transistors 210, 220, and 230, and voltage source 50. Transistor 210 is an NPN small signal complimentary transistor (e.g. type 2N2222A), transistor 220 is PNP complimentary power transistor (e.g. type SFT503), and transistor 230 is a diode connected transistor (e.g. type 2N2907A). The base-emitter connection of transistor 100 is back to back with transistor 200. That is, the emitter of transistor 100 is connected to the emitter of transistor 200. The emitters of both transistors 100 and 200 serve as an input to voice coil 400.

Referring to the positive segment of the circuit, the collector of transistor 100 is connected to the base of transistor 110 and the positive power terminal of op amps 20 and 80 (through resistor 115). The collector of transistor 110 is connected to the base of transistor 120. The collector of transistor 110 is also shunted through capacitor 117 to ground. Capacitor 117 enhances low impedance of the voltage loop (voice coil 400→Resistor 425→op amp 20) at high frequencies and reduces any tendency towards oscillation. Transistor 120 is coupled with resistor 119 in a diode-connected configuration. Resistors 115 and 119 prevent any leakage current from inadvertently turning on any downstream transistors. The emitter of transistor 120 is connected to the input of the voice coil 400. Transistor 130 is diode-connected and serves to clamp inductive output spikes to the rail of power supply 40 for voltage protection. Transistors 110, 120, and 130 are powered by voltage source 40.

Referring to the negative segment of the amplifier circuit 10, the collector of transistor 200 is connected to the negative power terminals of op amps 20 and 80 (through resistor 215) and to the base of transistor 210. The emitter of transistor 210 is connected to the negative power terminals of op amps 20 and 80. The collector of transistor 210 is shunted to ground through capacitor 217, and connected to the base of transistor 220. Capacitor 217 enhances low impedance of a voltage loop (voice coil 400→Resistor 425→op amp 20) at high frequencies and reduces any tendency towards oscillation. Transistor 220 is coupled with resistor 219 in a diode-connected configuration. Resistors 215 and 219 prevent any leakage current from inadvertently turning on any downstream transistors. The emitter of transistor 220 is connected to the input of the voice coil 400. Transistor 230 is diode-connected and serves to clamp inductive output spikes to the rail of power supply 50 for voltage protection. More specifically, transistors 130 and 230, being configured as diodes, use the collector-base junction for a higher voltage rating. This helps to prevent reverse voltage damage to transistors 110, 120, 210, and 220 if the output is held high with an inductive load and either voltage source 40 or voltage source 50 is removed. In particular, transistors 130 and 230 are used during startups and shutdowns, and they clamp output voltage to supply voltage. Transistors 210, 220, and 230 are powered by voltage source 50.

A voice coil 400 has a capacitor 420 in parallel with a series combination of an inductor 405 and a resistor 410. The voice coil output is shunted to ground through resistor 425, and serves as negative feedback to op amp 20.

The amplifier 10 is a class B amplifier, i.e. either the positive portion (voltage source 40 and transistors 110, 120, and 130) of the amplifier is operating, or the negative portion (voltage source 50 and transistors 210, 220, and 230) is operating. The positive and negative segments of the amplifier 10 do not operate simultaneously. Also, the positive and negative portions of the amplifier circuit operate in the same manner, except of course that, as a result of the reverse biasing of transistors 100 and 200, the top positive portion operates when a positive voltage is supplied to transistors 100/200, while the negative portion operates when a negative voltage is supplied to transistors 100/200. Additionally, the positive portion of the amplifier sources current to the load 400 (i.e. current flows from the voltage source 40 through transistor 120 to the load 400), and the negative portion of the circuit sinks current from the load (i.e. current flows from the load 400 through transistor 220 and into voltage source 50).

The operation of the amplifier circuit will now be described. In this example, the following resistances and capacitances will be used.

| R64 | 51.1 KΩ | R75 | 1 kΩ | R84 | 10 kΩ |
|---|---|---|---|---|---|
| R86 | 10 kΩ | R102 | 470 Ω | R104 | 470 Ω |
| R115 | 470 Ω | R119 | 470 Ω | R215 | 470 Ω |
| R219 | 470 Ω1 | R410 | 19 Ω | R425 | 1 Ω |
| C60 | 0.002 μf | C62 | 10 pf | C82 | 22 pf |
| C117 | 1000 pf | C217 | 1000 pf | C420 | 63 pf |
| C430 | 0.0047 μf | | | | |

It should be understood that these magnitudes are meant for illustrative purposes only, not as limitations, and that the amplifier circuit of the present invention can work with other values and components in other situations and conditions as determined by one of ordinary skill in the art. For example, op amps other than AD8610 could be used for op amps 20 and 80. As another example, resistances other than 10K ohms could be used for resistors 84 and 86. Indeed, the resistances need not even be equal for resistors 84 and 86, since their primary function is to determine the gain of op amp 80. In an embodiment however, resistors 84 and 86 are equal or nearly equal in order that the gain of op amp 80 is 2(1+R84/R86). Additionally, some components, such as the resistors 84 and 86, may have to be adjusted in value depending on the magnitude of the signals supplied to the circuit.

The following example illustrates the manner is which the amplifier 10 maintains the precise relationship between the input voltage of source 30 and the output current of voice coil 400. In this example, the signal source 30 provides a voltage of +0.5V. With an input voltage of +0.5V, transistor 200 will be off since $V_{be}$ is reverse biased, and transistor 210 will likewise be off since the leakage current of transistor 200 multiplied by the resistance of R215 will be less than 0.5 V. Similarly, transistor 230 will be off since the leakage current of transistor 210 multiplied by the resistance of R219 will be less than 0.5 V.

When the signal source 30 supplies a +0.5V signal, that causes the outer control loop of the circuit (i.e. voice coil 400, resistor 425, and op amp 20) to force the inverting and non-inverting inputs of op amp 20 to reach the same value (in a relatively short period of time). This is the case since op amp 20 has a large DC gain resulting from the large feedback impedance with capacitor 60. Therefore, $V(30)=V(R425)=R425*I(R425)$; or $I(R425)=I(\text{coil})=V(30)/R425=0.5 \text{ V}/1\Omega=0.5 \text{ A}.$ Resistor 425 acts as a current to voltage converter converting the voice coil output current into a voltage, and the voltage drop across resistor 425 serves as input into the negative input terminal of op amp 20. The output of op amp 20 is fed into op amp 80 and is amplified by a factor of 2 (since the gain of op amp 80 is (1+R84/R86)). This ensures that the output voltage across the coil 400 (R425) is not limited by the output range of op amp 20. This is also the gain seen by the coil 400. Capacitor 430 is used to maintain a low output impedance at high frequencies past the transistors' 100/200 crossover frequency. Now, if the internal resistance of the coil 400 (R410) for example is 19 ohms, then the coil voltage with respect to ground is:

$V(\text{Coil})=IR=0.5\text{A}*(R_{coil}+R425)=0.5\text{A}*(19+1)=10\text{V}.$

Therefore, the output of op amp 20 is:

$V(\text{coil})/\text{Gain}=10/2=5\text{V}.$

Op amp 80 biases transistors 100/200 so that V(coil) is equal to 10 V. The biasing of transistor 100 provides base current to transistor 110 to turn it on, which in turn provides base current to transistor 120 to turn it on. Resistors 102 and 104 provided negative feedback for the discrete transistors 100/200 to establish a voltage gain of R102/R104. Then, assuming that the transistor gain is sufficiently high ($\beta$>100) so that base current is negligible:

$V(R104)=V(R102)=10V/2=5 \text{ V}.$

Similarly, if the input to the amplifier circuit 10 from signal source 30 is −0.5 V, then transistor 100 will be off since $V_{be}$ is reverse biased, and transistor 110 will likewise be off since the leakage current of transistor 100 multiplied by the resistance of R115 will be less than 0.5 V. Similarly, transistor 130 will be off since the leakage current of transistor 110 multiplied by the resistance of R119 will be less than 0.5 V.

When the signal source 30 supplies a −0.5V signal, that causes the outer control loop of the circuit (i.e. voice coil 400, resistor 425, and op amp 20) to force the inverting and non-inverting inputs of op amp 20 to reach the same value (in a relatively short period of time). This is the case since op amp 20 has a large DC gain resulting from the large feedback impedance with capacitor 60. Therefore, $V(30)=V(R425)=R425*I(R425)$; or $I(R425)=I(\text{coil})=V(30)/R425=-0.5 \text{ V}/1 \text{ }\Omega=-0.5 \text{ A}.$ Resistor 425 acts as a current to voltage converter converting the voice coil output current into a voltage, and the voltage drop across resistor 425 serves as input into the negative input terminal of op amp 20. The output of op amp 20 is fed into op amp 80 and is amplified by a factor of 2 (since the gain of op amp 80 is (1+R84/R86)). This ensures that the output voltage across the coil 400 (R425) is not limited by the output range of op amp 20. This is also the gain seen by the coil 400. Now, if the internal resistance of the coil 400 (R410) for example is 19 ohms, then the coil voltage with respect to ground is:

$$V(\text{Coil}) = IR = -0.5\ A^*(R\text{coil} + R425) = -0.5\ A^*(19+1) = -10\ V.$$

Therefore, the output of op amp 20 is:

$$V(\text{coil})/\text{Gain} = -10/2 = -5\ V.$$

Op amp 80 biases transistors 100/200 so that V(coil) is equal to −10 V. The biasing of transistor 200 provides base current to transistor 210 to turn it on, which in turn provides base current to transistor 220 to turn it on. Then, assuming that the transistor gain is sufficiently high ($\beta$>100) so that base current is negligible:

$$V(R104) = V(R102) = -10V/2 = -5\ V.$$

Embodiments of the amplifier of the invention are especially useful in driving inductive loads in which the load current is proportional to the source voltage of the amplifier circuit. Also, systems embodying the invention may include a control loop to regulate the load current. That is, the current through the inductive load can be measured, determined if it is high or low, and the voltage input into the amplifier adjusted accordingly so as to raise or lower the current through the inductive load.

While the invention has been described in its preferred embodiment and other embodiments, it is to be understood that the words used are words of description rather than limitation and that changes may be made within the purview of the appended claims without departing from the true scope and spirit of the invention in its broader aspects.

The invention claimed is:

1. An amplifier comprising:
   a first voltage source;
   a first operational amplifier coupled to said first voltage source;
   a second operational amplifier coupled to the output of said first operational amplifier;
   a first NPN transistor and a first PNP transistor coupled to an output of said second operational amplifier, said first NPN transistor and said first PNP transistor coupled back to back;
   a second PNP transistor, the base of said second PNP transistor coupled to the collector of said first NPN transistor;
   a second NPN transistor, the base of said second NPN transistor coupled to the collector of said first PNP transistor;
   a third NPN transistor, the base of said third NPN transistor coupled to the collector of said second PNP transistor;
   a third PNP transistor, the base of said third PNP transistor coupled to the collector of said second NPN transistor;
   a voice coil, wherein the emitters of said first NPN transistor, said first PNP transistor, said third NPN transistor, and said third PNP transistor are coupled to the input of said voice coil; and
   a resistance, said resistance coupled to the output of said voice coil and the negative input terminal of said first op amp.

2. The amplifier of claim 1, further comprising:
   a first diode connected transistor, the collector of said first diode connected transistor coupled to the collector of said third NPN transistor and the emitter of said second PNP transistor; and
   a second diode connected transistor, the collector of said second diode connected transistor coupled to the collector of said third PNP transistor and to the emitter of said second PNP transistor.

3. The amplifier of claim 1, further comprising;
   a second voltage source; and
   a third voltage source;
   said second voltage source coupled to the positive power terminals of said first op amp and said second op amp, and said second PNP transistor, said third NPN transistor, and said first diode connected transistor; and
   said third voltage source coupled to the negative power terminals of said first op amp and said second op amp, and said second NPN transistor, said third PNP transistor, and said second diode connected transistor.

4. The amplifier of claim 1, further comprising negative feedback to said first op amp comprising a first resistor, a first capacitor, and a second capacitor, said first resistor connected in parallel with said first capacitor, and said second capacitor connected in series with said first resistor and said first capacitor.

5. The amplifier of claim 1, further comprising negative feedback to said second op amp comprising a capacitor in parallel with a first resistor and a second resistor, said feedback further coupled to said emitter of said second NPN transistor and said emitters of said first NPN transistor and said first PNP transistor.

6. The amplifier of claim 1, further comprising:
   a first resistor; and
   a second resistor;
   said first resistor coupled to the base of said second PNP transistor; and
   said second resistor coupled to the base of said second NPN transistor.

7. The amplifier of claim 6, further comprising:
   a third resistor and a fourth resistor, said third resistor and said fourth resistor coupled to the emitters of said first NPN transistor and said first PNP transistor.

8. The amplifier of claim 4, further comprising:
   a third capacitor; and
   a fourth capacitor;
   said third capacitor coupled to the collector of said second PNP transistor and the base of said third NPN transistor; and
   said fourth capacitor coupled to the collector of said second NPN transistor and to the base of said third PNP transistor.

9. The amplifier of claim 1, further comprising a feed back loop so that said first voltage source is adjusted based on the output current of said voice coil.

10. An amplifier to control the output current of an inductive load, comprising:
    a first voltage source;
    a first operational amplifier coupled to said first voltage source;
    a second operational amplifier coupled to the output of said first operational amplifier;

a first NPN transistor and a first PNP transistor coupled to an output of said second operational amplifier, said first NPN transistor and said first PNP transistor coupled back to back;

a second PNP transistor, the base of said second PNP transistor coupled to the collector of said first NPN transistor;

a second NPN transistor, the base of said second NPN transistor coupled to the collector of said first PNP transistor;

a third NPN transistor, the base of said third NPN transistor coupled to the collector of said second PNP transistor;

a third PNP transistor, the base of said third PNP transistor coupled to the collector of said second NPN transistor;

an inductive load, wherein the emitters of said first NPN transistor, said first PNP transistor, said third NPN transistor, and said third PNP transistor are coupled to the input of said inductive load; and a resistance, said resistance coupled to the output of said voice coil and the negative input terminal of said first op amp.

11. The amplifier of claim 10, further comprising:
a first diode connected transistor, the collector of said first diode connected transistor coupled to the collector of said third NPN transistor and the emitter of said second PNP transistor; and a second diode connected transistor, the collector of said second diode connected transistor coupled to the collector of said third PNP transistor and to the emitter of said second PNP transistor.

12. The amplifier of claim 10, further comprising;
a second voltage source; and
a third voltage source;
said second voltage source coupled to the positive power terminals of said first op amp and said second op amp, and said second PNP transistor, said third NPN transistor, and said first diode connected transistor; and
said third voltage source coupled to the negative power terminals of said first op amp and said second op amp, and said second NPN transistor, said third PNP transistor, and said second diode connected transistor.

13. The amplifier of claim 10, further comprising negative feedback to said first op amp comprising a first resistor, a first capacitor, and a second capacitor, said first resistor connected in parallel with said first capacitor, and said second capacitor connected in series with said first resistor and said first capacitor.

14. The amplifier of claim 10, further comprising negative feedback to said second op amp comprising a capacitor in parallel with a first resistor and a second resistor, said feedback further coupled to said emitter of said second NPN transistor and said emitters of said first NPN transistor and said first PNP transistor.

15. The amplifier of claim 10, further comprising:
a first resistor; and
a second resistor;
said first resistor coupled to the base of said second PNP transistor; and
said second resistor coupled to the base of said second NPN transistor.

16. The amplifier of claim 15, further comprising:
a third resistor and a fourth resistor, said third resistor and said fourth resistor coupled to the emitters of said first NPN transistor and said first PNP transistor.

17. The amplifier of claim 13, further comprising:
a third capacitor; and
a fourth capacitor;
said third capacitor coupled to the collector of said second PNP transistor and the base of said third NPN transistor; and
said fourth capacitor coupled to the collector of said second NPN transistor and to the base of said third PNP transistor.

18. The amplifier of claim 10, further comprising a feed back loop so that said first voltage source is adjusted based on the output current of said voice coil.

19. An amplifier comprising:
a first voltage source;
an op amp coupled to said first voltage source;
a first NPN transistor coupled back to back with a first PNP transistor, said first NPN transistor and said first PNP transistor coupled to the output of said op amp;
a positive segment coupled to the emitter of said first NPN transistor, said positive segment comprising a second PNP transistor and a third NPN transistor;
a negative segment coupled to the emitter of said first PNP transistor, said negative segment comprising a second NPN transistor and a third PNP transistor;
an inductive load connected to the emitters of said third NPN transistor and said third PNP transistor; and
a resistance coupled to an output of said inductive load;
wherein said resistance is coupled to the negative input terminal of said op amp.

20. The amplifier of claim 19, further comprising:
a second voltage source;
a third voltage source;
a first diode connected transistor, said first diode connected transistor coupled to the collector of said third NPN transistor and said second voltage source; and
a second diode connected transistor, said second diode connected transistor coupled to the collector of said third PNP transistor and said third voltage source.

* * * * *